United States Patent
Kim et al.

(10) Patent No.: US 7,382,348 B2
(45) Date of Patent: Jun. 3, 2008

(54) SHIFT REGISTER

(75) Inventors: Young Sik Kim, Gyeongsangbuk-do (KR); Su Hwan Moon, Gyeongsangbuk-do (KR); Sun Yong Lee, Gumi-si (KR); Kwang Sik Hwang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 708 days.

(21) Appl. No.: 11/022,849

(22) Filed: Dec. 28, 2004

(65) Prior Publication Data

US 2005/0156860 A1 Jul. 21, 2005

(30) Foreign Application Priority Data

Dec. 29, 2003 (KR) ............... 2003-99237

(51) Int. Cl.
*G09G 3/36* (2006.01)

(52) U.S. Cl. ......................... 345/100; 345/87

(58) Field of Classification Search .............. 345/87, 345/92, 94, 98–100, 211–214; 377/64, 71, 377/73, 75, 78–79; 326/40

See application file for complete search history.

(56) References Cited

U.S. PATENT DOCUMENTS 5,859,630 A * 1/1999 Huq ..................... 345/100
6,300,928 B1 * 10/2001 Kim ..................... 345/92
6,919,875 B2 * 7/2005 Abe et al. .............. 345/100
2004/0104882 A1 * 6/2004 Kitani et al. ........... 345/100
2004/0227718 A1 * 11/2004 Park ..................... 345/100

* cited by examiner

*Primary Examiner*—Richard Hjerpe
*Assistant Examiner*—Mansour M. Said
(74) *Attorney, Agent, or Firm*—McKenna Long & Aldridge LLP

(57) ABSTRACT

A shift register having an amorphous silicon thin film transistor for decreasing a distortion of the output signal is disclosed. In the shift register having a plurality of stages for shifting an input signal using first and second driving voltages, first and second clock signals and a start pulse, each of said plurality of stages includes an output buffer for selectively applying any one of the first and second clock signals and the second driving voltage to an output line under control of first and second nodes; a pre-charger for pre-charging the first driving voltage into the first node in response to said start pulse; a second node controller for selectively supplying the first and second driving voltages to the second node in such a manner to be opposite to the first node using said start pulse and an output signal of the next stage; and a first node controller for supplying the second driving voltage to the first node in a time interval excluding the time interval for said pre-charging.

20 Claims, 7 Drawing Sheets

SHIFT REGISTER

This application claims the benefit of Korean Patent Application No. 2003-99237, filed on Dec. 29, 2003 which is hereby incorporated by reference for all purposes as if fully set forth herein.

BACKGROUND OF THE INVENTION

1. Field of the Invention

This invention relates to a driving circuit for a display device, and more particularly to a liquid crystal display (LCD) device having a shift register configured with amorphous silicon thin film transistors.

2. Discussion of the Related Art

Generally, a liquid crystal display (LCD) used as a display device for a television or a computer controls light transmittance of a liquid crystal using an electric field to thereby display a picture. To this end, the LCD includes a liquid crystal display panel having liquid crystal cells arranged in a matrix configuration, and a driving circuit for driving the liquid crystal display panel.

In the liquid crystal display panel, gate lines and data lines are arranged in such a manner to cross each other. A liquid crystal cell is positioned at each area defined by the gate lines and the data lines. The liquid crystal display panel is provided with pixel electrodes and a common electrode for applying an electric field to each liquid crystal cell. Each of the pixel electrodes is connected to any one of the data lines, via the source and drain terminals of a thin film transistor (TFT), which serves as a switching device. The gate terminal of the TFT is connected to any one of the gate lines.

The driving circuit includes a gate driver for driving the gate lines, and a data driver for driving the data lines. The gate driver sequentially applies a scanning signal to the gate lines to sequentially drive the liquid crystal cells on the liquid crystal display panel. The data driver applies a video signal to each data line whenever the scanning signal is applied to any one of the gate lines. Thus, the LCD controls light transmittance by an electric field applied between the pixel electrode and the common electrode in accordance with a video signal for each liquid crystal cell, thereby displaying a picture.

In such a driving circuit, the gate driver generates a scanning signal for sequentially driving the gate lines using a shift register. The data driver, which also includes a shift register, generates a sampling signal for sequentially sampling video signals inputted from the exterior thereof.

FIG. 1 is a block diagram illustrating a configuration of a general two-phase shift register.

Referring to FIG. 1, the shift register includes 1st to nth stages connected in cascade. The 1 st to nth stages are commonly supplied with first and second clock signals C1 and C2 along with high-level and low-level driving voltages VDD and VSS, and are supplied with a start pulse Vst or an output signal of the previous stage. The 1st stage outputs a first output signal Out1 in response to the start pulse Vst and the first and second clock signals C1 and C2. The 2nd to nth stages output 2nd to nth output signals, respectively, in response to the output signal of the previous stage and the first and second clock signals C1 and C2. The 1st to nth stages have an identical circuit configuration, and sequentially shift a specific voltage of the start pulse Vst. The 1st to nth output signals Out1 to Outn are supplied as a scanning signal for sequentially driving the gate lines of the liquid crystal display panel, or as a sampling signal for sequentially sampling a video signal within the data driver.

FIG. 2 shows a detailed circuit configuration of one stage of the shift register illustrated in FIG. 1.

In FIG. 2, the stage includes a fifth NMOS transistor T5 for outputting a first clock signal C1 to an output line under control of a Q node, a sixth NMOS transistor T6 for outputting a low-level driving voltage VSS under control of a QB node, and first to fourth NMOS transistors T1 to T4 for controlling the Q node and the QB node.

Such a stage is supplied with the high-level and low-level voltages VDD and VSS, and with the start pulse Vst and the first and second clock signals C1 and C2, as illustrated in FIG. 3. Herein, the second clock signal C2 is a signal in which a high-state voltage and a low-state voltage each having certain pulse width are alternately supplied, whereas the first clock signal C1 is a signal having a voltage opposite to the second clock signal C2. A high state of the start pulse Vst is synchronized with a high state of the second clock signal C2. The start pulse Vst is a signal supplied from the exterior or an output signal of the previous stage.

Hereinafter, an operation procedure of the stage will be described with reference to driving waveforms illustrated in FIG. 3.

In a period of 'A', the first NMOS transistor T1 is turned on by a high-state second clock signal C2 to thereby apply a high-state voltage of the start pulse Vst to the Q node, that is, pre-charge it thereto. The high-stage voltage pre-charged to the Q node turns on the fifth NMOS transistor T5 to thereby apply a low-state voltage of the first clock signal to the output line. At this time, the second NMOS transistor T2 also is turned on by said high-state second clock signal to thereby apply a high-level driving voltage VDD to the QB node. Then, the high-level driving voltage VDD supplied to the QB node turns on the sixth NMOS transistor T6 to thereby supply a low-level driving voltage VSS. Thus, in the 'A' period, the output line of the stage outputs a low-state output signal OUT.

In a period of 'B', the first NMOS transistor T1 is turned off by a low-state second clock signal C2 to thereby float the Q node into a high state. Thus, the fifth NMOS transistor T5 maintains a turn-on state. At this time, as the first clock signal C1 has a high-state voltage, the floated Q node is boot-strapped by an effect of an internal capacitor Cgs provided between the gate and the drain of the fifth NMOS transistor T5 and a capacitor CB. Accordingly, a voltage at the Q node is further increased to continuously turn on the fifth NMOS transistor T5, thereby rapidly supplying a high-state voltage of the first clock signal C1 to the output line. Further, the Q node floated into a high state turns on the fourth NMOS transistor T4 and a high-state first clock signal C1 turns on the third NMOS transistor T3 to supply the low-level driving voltage VSS to the QB node, thereby turning off the sixth NMOS transistor T6. Thus, in the 'B' period, the output line of the stage outputs a high-state output signal OUT.

In a period of 'C', the first NMOS transistor T1 is turned on by a high-state second clock signal C2 to supply a low-state voltage of the start pulse Vst to the Q node, thereby turning off the fifth NMOS transistor T5. At this time, the second NMOS transistor T2 is turned on by a high-state second clock signal C2 to supply the high-level driving voltage VDD to the QB node, thereby turning on the sixth NMOS transistor T6 to output the low-level driving voltage VSS to the output line. At this time, the third NMOS transistor T3 is turned off by a low-stage first clock signal C1 and the fourth NMOS transistor T4 is turned off by the low-state Q node, thereby maintaining the high-level driving voltage VDD at the Q node. Thus, in the 'C' period, the output line of the stage outputs a low-state output signal OUT.

In a period of 'D', the second NMOS transistor T2 is turned off by a low-state second clock signal C2 and the fourth NMOS transistor T4 is turned off by the low-state Q node, thereby floating the QB node with the high-level driving voltage VDD supplied in the previous period 'C', even though the third NMOS transistor T3 is turned on by a high-state first clock signal C1. Thus, the sixth NMOS transistor T6 maintains a turn-on state to thereby output the low-level driving voltage VSS to the output line. As a result, in the 'D' period, the output line of the stage outputs a low-state output signal OUT.

In the remaining periods, the 'C' and 'D' periods are alternately repeated, so that the output signal OUT of the stage continuously maintains a low state.

Recently, various attempts have been made to apply a polycrystalline silicon TFT technique, which can directly form a shift register on a glass substrate, to display devices. However, when the shift register of a display device is configured with amorphous silicon TFTs, some characteristics of the output signal OUT such as the rising time and falling time thereof, etc. are poor due to a parasitic capacitor Cgs existing in the interior of the thin film transistors. In order to solve this, a scheme of enlarging the channel width of the amorphous TFTs has been suggested. However, the enlarged channel width of the amorphous TFTs creates a high turn-off leakage current, which distorts the output signal of the shift register and makes it difficult for the shift register to maintain a low state. More particularly, the voltage at the QB node in the 'D' period, which is floated into a high state, becomes unstable because of the high leakage current of the amorphous silicon TFT having an enlarged channel width. Therefore, the sixth NMOS transistor T6 requiring maintaining a turn-on state becomes also unstable, thereby distorting a low state of the output signal OUT.

SUMMARY OF THE INVENTION

Accordingly, the present invention is directed to a shift register used for a display device that substantially obviates one or more of the problems due to limitations and disadvantages of the related art.

An advantage of the present invention is to provide a shift register configured with amorphous silicon thin film transistors that has an improved output signal.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a shift register having a plurality of stages for shifting an input signal using first and second driving voltages, first and second clock signals and a start pulse, each of said plurality of stages includes an output buffer for selectively applying any one of the first and second clock signals and the second driving voltage to an output line under control of first and second nodes; a pre-charger for pre-charging the first driving voltage into the first node in response to said start pulse; a second node controller for selectively supplying the first and second driving voltages to the second node in such a manner to be opposite to the first node using said start pulse and an output signal of the next stage; and a first node controller for supplying the second driving voltage to the first node in a time interval excluding the time interval for said pre-charging.

In the shift register, said second clock signal has a phase opposite to said first clock signal.

Said first and second clock signals are alternately applied to the plurality of stages.

Said first driving voltage is higher than said second driving voltage.

In the shift register, the pre-charger includes a first transistor connected between an input line of said first driving voltage and the first node to be controlled by said start pulse.

In the shift register, the second node controller includes a second transistor connected to an input line of said first driving voltage and a third node in a diode type; a third transistor connected, in parallel, to the second transistor to be controlled by an output signal of the next stage; a fourth transistor connected between a third node and an input line of said second driving voltage to be controlled by said start pulse; a fifth transistor connected, in parallel, to the fourth transistor to be controlled by the first node; a sixth transistor connected between the input line of said first driving voltage and the second node to be controlled by the third node; and a seventh transistor connected between the second node and the input line of said second driving voltage to be controlled by the first node.

Herein, the second and third node are always supplied with said first driving voltage in a time interval when the output buffer supplies said second driving voltage.

In the shift register, the first node controller includes an eighth transistor connected between the first node and the input line of said second driving voltage to be controlled by the second node.

In the shift register, the output buffer includes a ninth transistor connected between the input line of any one of said clock signals and the output line to be controlled by the first node; and a tenth transistor connected between the output line and the input line of said second driving voltage to be controlled by the second node.

Herein, the output buffer includes a capacitor connected to the ninth transistor to boot-strap the pre-charged first node using any one of said clock signals.

In the shift register, the first node controller includes an eleventh transistor connected, in parallel, to the eighth transistor to be controlled by an output signal of the next stage.

In the shift register, the stage is configured by the same channel-type transistor.

The stage is configured by NPMOS transistors.

The stage is configured by an amorphous-silicon thin film transistor.

In another aspect of the present invention, a display device having a shift register, wherein the shift register includes at least two stages for shifting an input signal and receives first and second driving voltages, first and second clock signals and a start pulse, each of the two stages includes an output buffer for selectively applying any one of the first and second clock signals and the second driving voltage to an output line under control of first and second nodes; a pre-charger for pre-charging the first driving voltage into the first node in response to the start pulse; a second node controller for selectively supplying the first and second driving voltages to the second node in such a manner to be opposite to the first node using the start pulse and an output signal of the next stage; and a first node controller for supplying the second driving voltage to the first node in a time interval excluding the time interval for the pre-charging.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings. Hereinafter, an embodiment of the present invention will be described in detail with reference to FIGS. 4 to 7.

Figure 1:
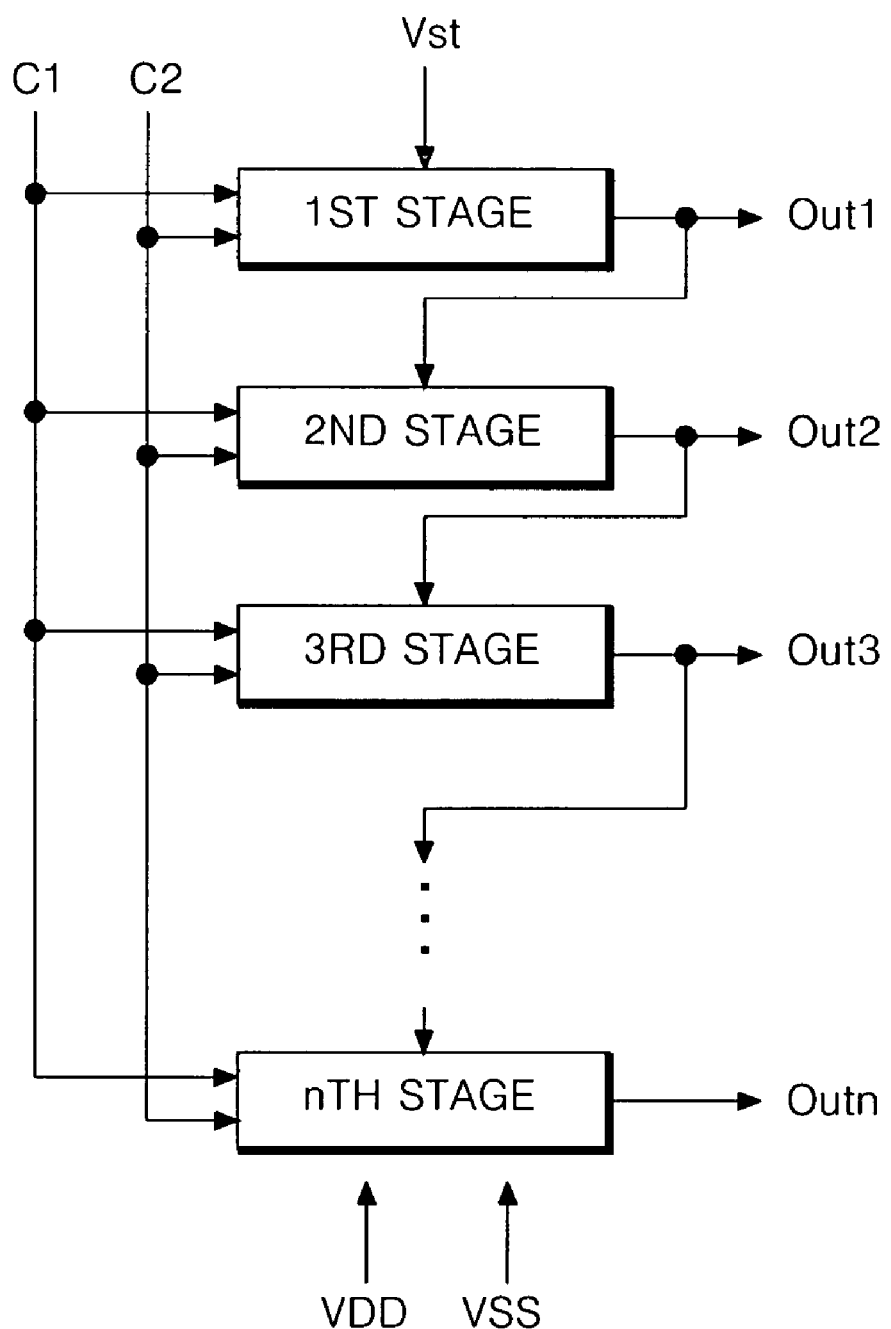
FIG. 1 is a schematic block diagram illustrating a configuration of a related art bi-phase shift register.
Figure 2:
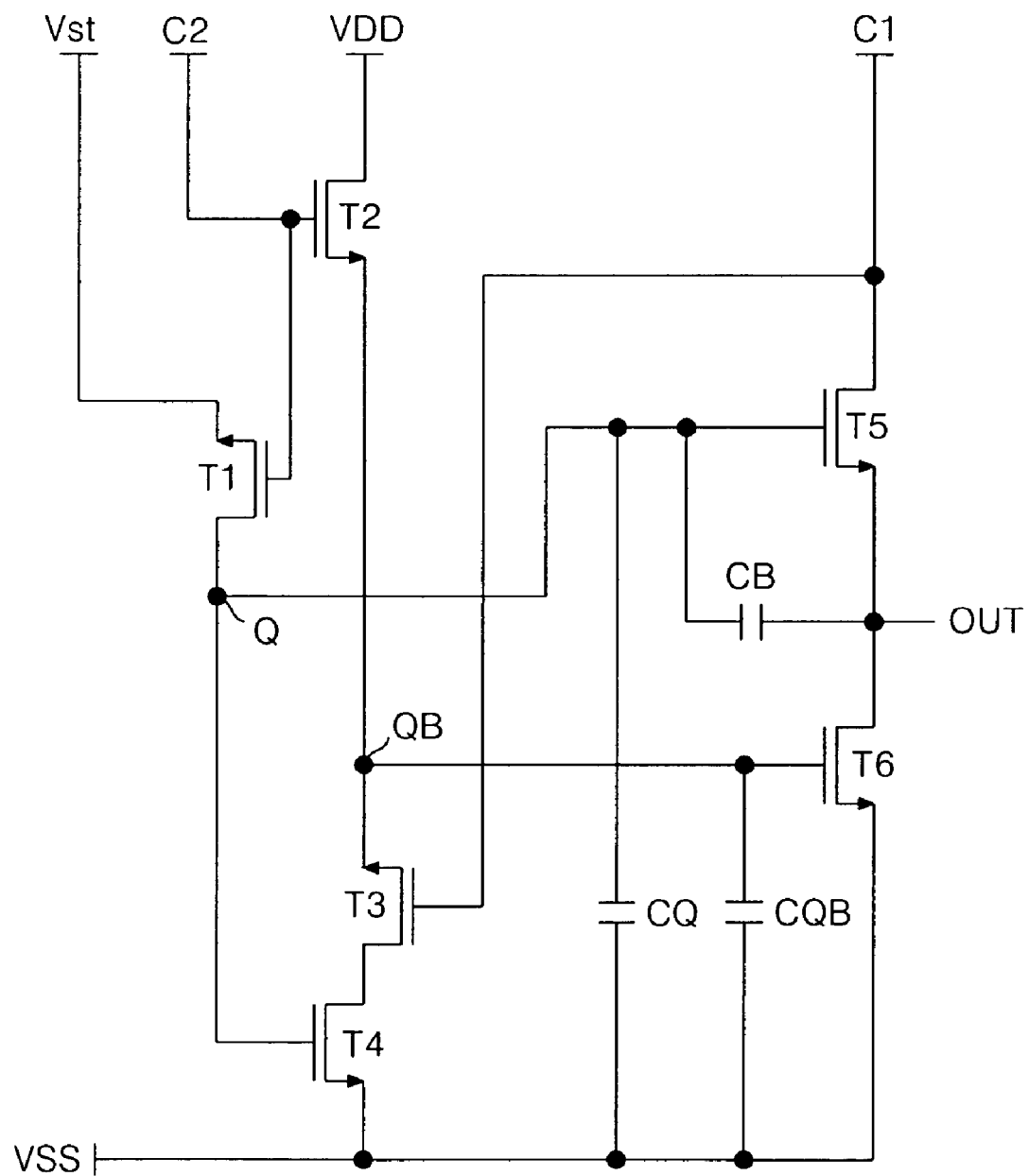
FIG. 2 is a detailed circuit diagram of the first stage of the shift register illustrated in FIG. 1.
Figure 3:
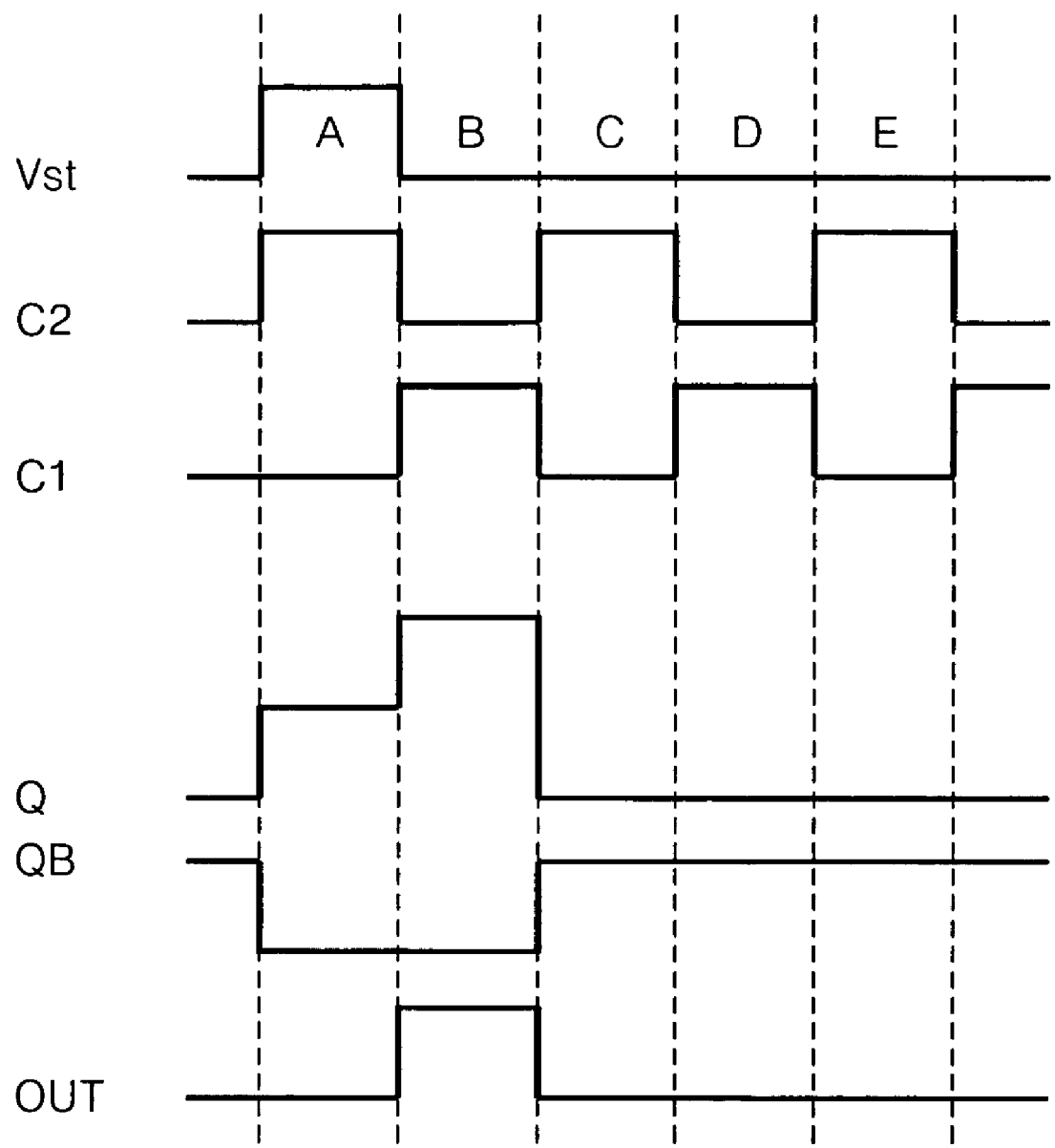
FIG. 3 is a driving waveform diagram of the stage illustrated in FIG. 2.
Figure 4:
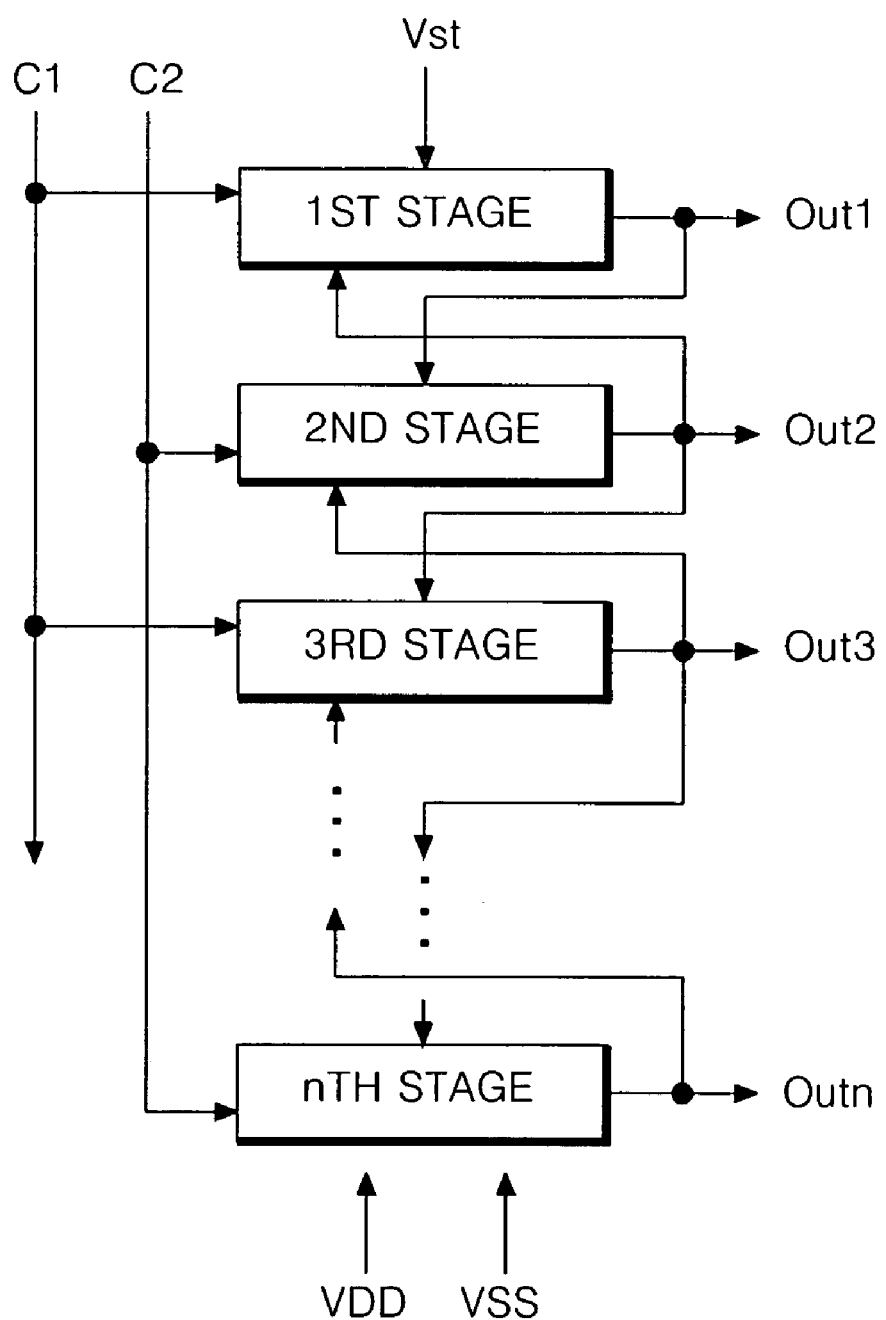
FIG. 4 is a schematic block diagram illustrating a configuration of a shift register according to an embodiment of the present invention.

FIG. 4 is a schematic block diagram illustrating a configuration of a shift register according to an embodiment of the present invention.

Referring to FIG. 4, the shift register includes 1st to nth stages connected in cascade. The 1st to nth stages are commonly supplied with high-level and low-level driving voltages VDD and VSS. Further, the 1st to nth stages are supplied with any one of first and second clock signals C1 and C2. In other words, the 1st to nth stages are alternately supplied with the first and second clock signals C1 and C2. For example, the odd stages are supplied with the first clock signal C1 while the even stages are supplied with the second clock signal C2. Further, the 1st to nth stages are supplied with a start pulse Vst or an output signal of the previous stage as a start pulse, and with an output signal of the next stage. The 1st stage outputs a first output signal Out1 in response to the start pulse Vst, an output signal Out2 of the 2nd stage and the first clock signal C1. The 2nd to nth stages output 2nd to nth output signals Out2 to Outn, respectively, in response to the output signal of the previous stage, the output signal of the next stage and any one of the first and second clock signals C1 and C2. The 1st to nth stages have an identical circuit configuration, and sequentially shift a specific voltage of the start pulse Vst. The 1st to nth output signals Out1 to Outn are supplied as a scanning signal for sequentially driving the gate lines of the liquid crystal display panel, or as a sampling signal for sequentially sampling a video signal within the data driver.

Figure 5:
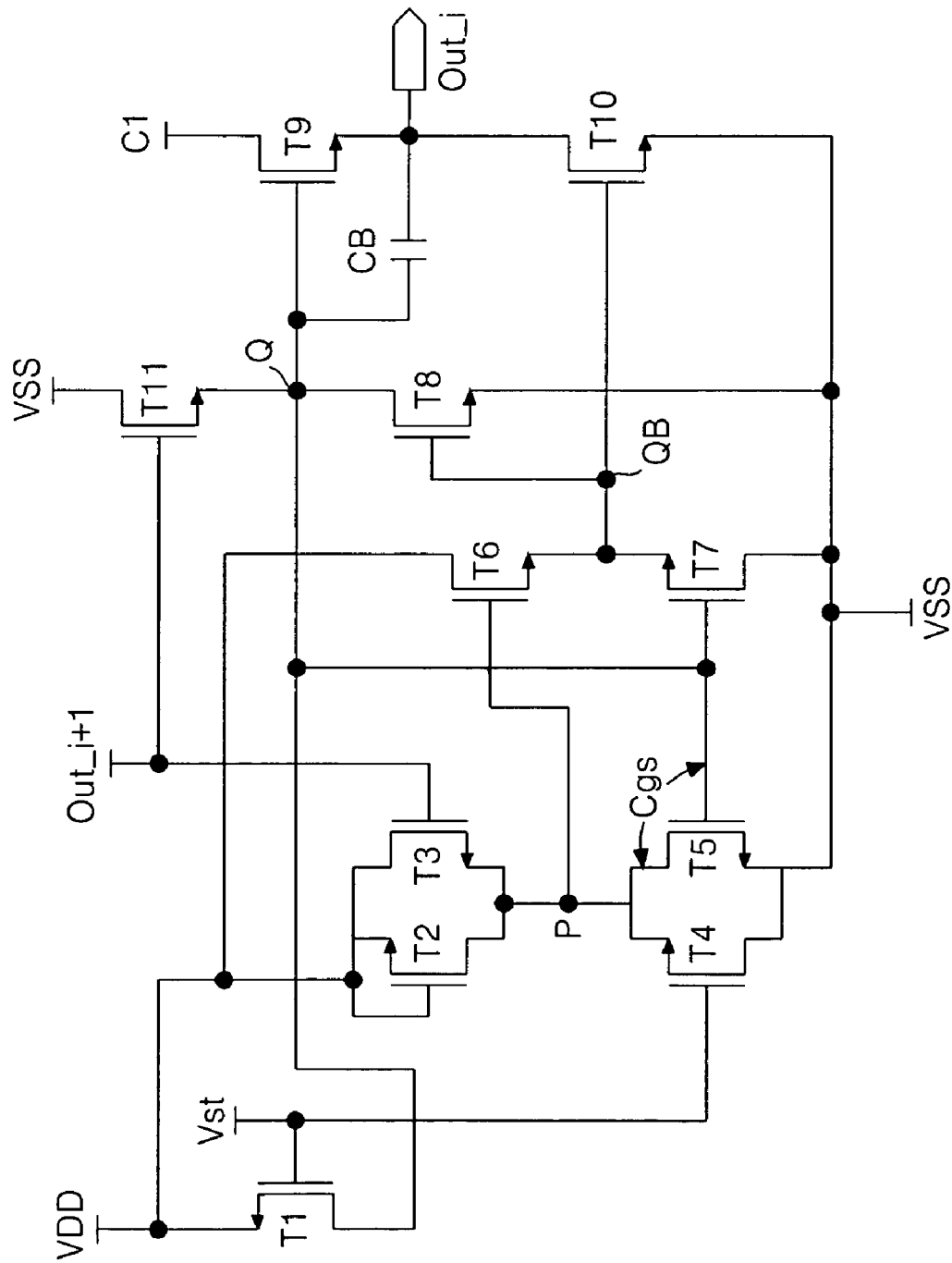
FIG. 5 is a detailed circuit diagram of one stage of the shift register illustrated in FIG. 4.
Figure 6:
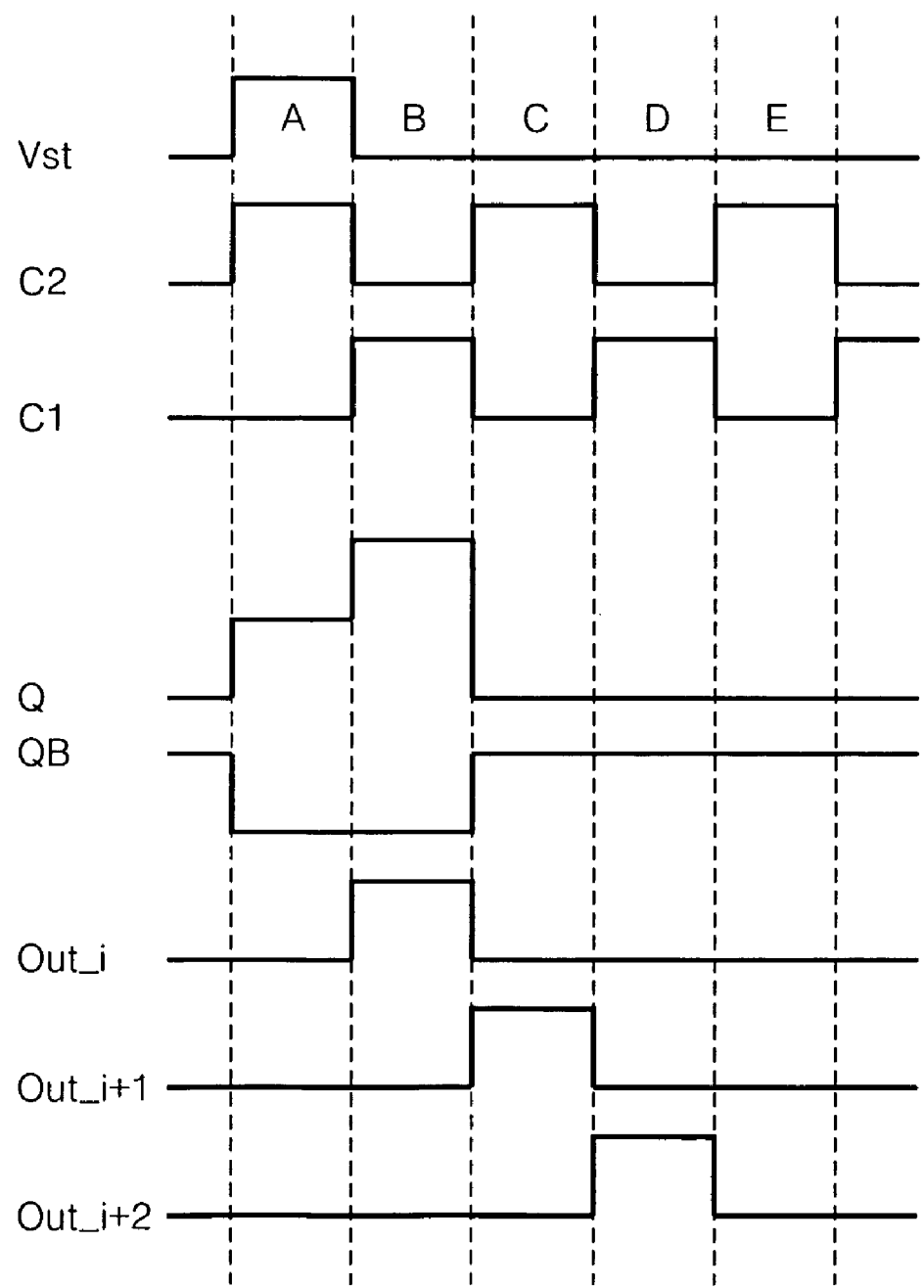
FIG. 6 is a driving waveform diagram of the stage illustrated in FIG. 4.

FIG. 5 shows a detailed circuit configuration of one stage of the shift register illustrated in FIG. 4, and FIG. 6 shows a driving waveform of the stage illustrated in FIG. 4.

Referring to FIG. 5, the stage includes an output buffer having a ninth NMOS transistor T9 for outputting a first clock signal C1 to an output line under control of a Q node and a tenth NMOS transistor T10 for outputting a low-level driving voltage VSS to the output line under control of a QB node, a pre-charger having a first NMOS transistor T1 for pre-charging the Q node, a first controller having second to seventh NMOS transistors T2 to T7 for controlling the QB node, and a second controller having eighth and eleventh NMOS transistors T8 and T11 for controlling the Q node.

The ninth NMOS transistor T9 of the output buffer is connected between an input line of the first clock signal C1 and an output line of the stage to be controlled by the Q node, whereas the tenth NMOS transistor T10 thereof is connected between the output line of the stage and an input line of a low-level driving voltage VSS to be controlled by the QB node.

The first NMOS transistor T1 of the pre-charger is connected between a supply line of a high-level driving voltage VDD and the Q node to be controlled by a start pulse Vst.

The second NMOS transistor T2 of the first controller is connected between the supply line of the high-level driving voltage VDD and a P node in a diode type, and the third NMOS transistor T3 thereof is connected, in parallel, to the second NMOS transistor T2 to be controlled by an output signal Out_i+1 of the next stage. The fourth NMOS transistor T4 is connected between the P node and the supply line of the low-level driving voltage VSS to be controlled by the start pulse Vst, and the fifth NMOS transistor T5 is connected, in parallel, to the fourth NMOS transistor T4 to be controlled by the Q node. The sixth NMOS transistor T6 is connected between the input line of the high-level driving voltage VDD and the QB node to be controlled by the P node, and the seventh NMOS transistor T7 is connected between the QB node and the input line of the low-level driving voltage VSS to be controlled by the Q node.

The eighth NMOS transistor T8 of the second controller is connected between the Q node and the input line of the low-level driving voltage VSS to be controlled by the QB node, and the eleventh NMOS transistor T11 thereof is connected to the eighth NMOS transistor T8 to be controlled by an output signal Out_i+1 of the next stage.

Such a stage is supplied with the high-level and low-level voltages VDD and VSS, and with the start pulse Vst and any one (i.e., first clock signal C1) of the first and second clock signals C1 and C2, as shown in FIG. 5. Further, the stage is supplied with the output signal Out_i+1 of the next stage.

Herein, the first clock signal C1 is a signal in which a high-state voltage and a low-state voltage each having a certain pulse width are alternately supplied, whereas the second clock signal C2 to be supplied to the next stage is a signal having a voltage opposite to the first clock signal C1. A high state of the start pulse Vst is synchronized, for example, with a low state of the first clock signal C1. The start pulse Vst may be a signal supplied from the exterior or an output signal of the previous stage.

Hereinafter, an operation procedure of the stage will be described with reference to the driving waveforms illustrated in FIG. 6.

In a period of 'A', the first NMOS transistor T1 is turned on by a high-state voltage of the start pulse Vst to thereby apply the high-level driving voltage VDD to the Q node and thus pre-charge the Q node into a high state. The Q node pre-charged with a high state turns on the ninth NMOS transistor T9 to thereby apply a low-state voltage of the first clock signal C1 to the output line. At this time, the P node becomes a low state with the aid of the second NMOS transistor T2, which always maintains a turn-on state, the fourth NMOS transistor T4 turned on by a high-state start pulse Vst and the fifth NMOS transistor T5 turned on by a high-state Q node. Thus, the sixth NMOS transistor T6 is turned off, and the seventh NMOS transistor T7 is turned on by a high-state Q node to apply the low-level driving voltage VSS to the QB node, thereby turning off the tenth NMOS transistor T10. Further, the eighth NMOS transistor T8 is turned off by a low-state QB node, and the eleventh NMOS transistor T11 is turned off by a low-state output signal Out_i+1 of the next stage. Thus, in the 'A' period, the output line of the stage outputs a low-state output signal Out_i.

In a period of 'B', the first NMOS transistor T1 is turned off by a low-state voltage of the start pulse Vst to thereby float the Q node into a high state. Thus, the ninth NMOS transistor T9 maintains a turn-on state. At this time, as a high-state voltage of the first clock signal C1 is supplied, the floated Q node is boot-strapped by an effect of a capacitor Cgs provided between the gate electrode and the drain electrode of the ninth NMOS transistor T9 and a capacitor CB. Accordingly, a voltage at the Q node is further increased to continuously turn on the ninth NMOS transistor T9, thereby rapidly supplying a high-state voltage of the first clock signal C1 to the output line. The operations of the second to eighth NMOS transistors T2 to T8; and the tenth and eleventh NMOS transistors T10 and T11 are identical to those in the 'A' period. Accordingly, in the 'B' period, the output line of the stage outputs a high-state output signal Out_i.

In a period of 'C', the first to fourth NMOS transistors T1 to T4 are turned off by a low-state start pulse Vst. At this time, the P node is supplied with the high-level driving voltage VDD to have a high state by the second NMOS transistor T2, which maintains a turn-on state, thereby turning on the sixth NMOS transistor T6. Further, the QB node is supplied with the high-level driving voltage VDD by the turned-on sixth NMOS transistor T6, so that the tenth NMOS transistor T10 is turned on to thereby apply the low-level driving voltage VSS to the output line. At this time, the eighth NMOS transistor T8 is turned on by the high-state QB node and the eleventh NMOS transistor T11 is turned on by a high-state output signal Out_i+1 of the next stage to thereby supply the low-level voltage VSS to the Q node. Thus, the fifth, seventh and ninth NMOS transistors T5, T7 and T9 are turned off by the low-state Q node. As a result, in the 'C' period, the output line of the stage outputs a low-state output signal Out_i.

In a period of 'D', the output signal Out_i+1 of the next stage has a low voltage state in comparison with the 'C' period, so that the eleventh NMOS transistor T11 is turned off, or the Q node maintains a low state by the turned-on eighth NMOS transistor T8. Thus, like the 'C' period, the P node and the QB node are continuously supplied with the high-level driving voltage VDD by the turned-on second, third and sixth NMOS transistors T2, T3 and T6, thereby maintaining a non-distorted high state irrespectively of the turned-off NMOS transistors T4, T5 and T7. As a result, the tenth NMOS transistor T10 maintains a normal turn-on state to thereby apply the low-level driving voltage VSS to the output line, so that the output signal Out_i maintains a non-distorted low state.

Furthermore, in the remaining periods, the stage operates in a similar way as the 'D' period, so that the output signal OUT of the stage maintains a non-distorted low state.

Figure 7:
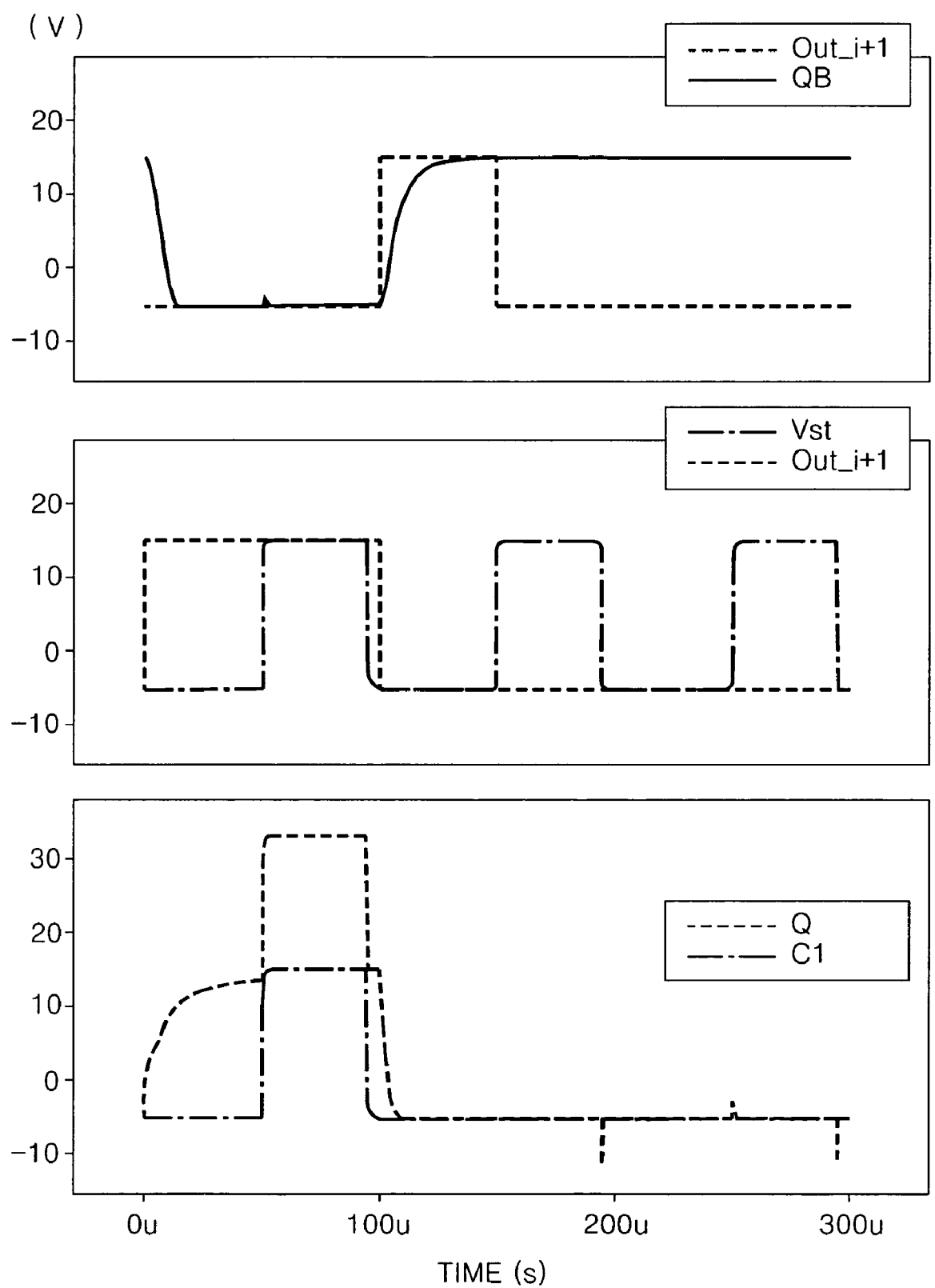
FIG. 7 is a simulated waveform diagram of the stage illustrated in FIG. 4.

As described above, in the shift register according to the embodiment of the present invention, the P node and the QB node are continuously supplied with the high-level driving voltage VDD during a time interval when a low-state output signal Out_i is applied to the output line of the stage, so that the thin film transistor can supply the low-level driving voltage VSS to the output line without any distortion, as illustrated in FIG. 7. Accordingly, even when a shift register according to the present invention is configured with amorphous silicon thin film transistors having an enlarged channel width, it can prevent a distortion of the output signal caused by the leakage current of the amorphous silicon thin film transistors.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A shift register having a plurality of stages for shifting an input signal using first and second driving voltages, first and second clock signals and a start pulse, each of said plurality of stages comprising:
   an output buffer for selectively applying any one of the first and second clock signals and the second driving voltage to an output line under control of first and second nodes;
   a pre-charger for pre-charging the first driving voltage into the first node in response to said start pulse;
   a second node controller for selectively supplying the first and second driving voltages to the second node in such a manner to be opposite to the first node using said start pulse and an output signal of the next stage; and
   a first node controller for supplying the second driving voltage to the first node in a time interval excluding the time interval for said pre-charging.

2. The shift register according to claim 1, wherein said second clock signal has a phase opposite to said first clock signal.

3. The shift register according to claim 1, wherein said first and second clock signals are alternately applied to the plurality of stages.

4. The shift register according to claim 1, wherein said first driving voltage is higher than said second driving voltage.

5. The shift register according to claim 1, wherein the pre-charger includes:
   a first transistor connected between an input line of said first driving voltage and the first node to be controlled by said start pulse.

6. The shift register according to claim 5, wherein the second node controller includes:
   a second transistor connected to an input line of said first driving voltage and a third node in a diode type;
   a third transistor connected, in parallel, to the second transistor to be controlled by an output signal of the next stage;
   a fourth transistor connected between a third node and an input line of said second driving voltage to be controlled by said start pulse;
   a fifth transistor connected, in parallel, to the fourth transistor to be controlled by the first node;

a sixth transistor connected between the input line of said first driving voltage and the second node to be controlled by the third node; and a seventh transistor connected between the second node and the input line of said second driving voltage to be controlled by the first node.

7. The shift register according to claim 6, wherein the second and third nodes are always supplied with said first driving voltage in a time interval when the output buffer supplies said second driving voltage.

8. The shift register according to claim 6, wherein the first node controller includes:

an eighth transistor connected between the first node and the input line of said second driving voltage to be controlled by the second node.

9. The shift register according to claim 8, wherein the output buffer includes:

a ninth transistor connected between the input line of any one of said clock signals and the output line to be controlled by the first node; and a tenth transistor connected between the output line and the input line of said second driving voltage to be controlled by the second node.

10. The shift register according to claim 9, wherein the output buffer includes:

a capacitor connected to the ninth transistor to boot-strap the pre-charged first node using any one of said clock signals.

11. The shift register according to claim 9, wherein the first node controller includes:

an eleventh transistor connected, in parallel, to the eighth transistor to be controlled by an output signal of the next stage.

12. The shift register according to claim 1, wherein one of the stages is configured by the same channel-type transistor.

13. The shift register according to claim 1, wherein one of the stages is configured by NPMOS transistors.

14. The shift register according to claim 1, wherein one of the stages is configured by an amorphous-silicon thin film transistor.

15. The shift register according to claim 1, wherein said start pulse is a signal from the external thereof or an output signal of the previous stage.

16. A display device having a shift register, wherein the shift register includes at least two stages for shifting an input signal and receives first and second driving voltages, first and second clock signals and a start pulse, each of the two stages comprising:

an output buffer for selectively applying any one of the first and second clock signals and the second driving voltage to an output line under control of first and second nodes;

a pre-charger for pre-charging the first driving voltage into the first node in response to the start pulse;

a second node controller for selectively supplying the first and second driving voltages to the second node in such a manner to be opposite to the first node using the start pulse and an output signal of the next stage; and a first node controller for supplying the second driving voltage to the first node in a time interval excluding the time interval for the pre-charging.

17. The display device according to claim 16, wherein the start pulse is a signal from the external thereof or an output signal of the previous stage.

18. The display device according to claim 16, wherein the two stages of the shift register is configured with an amorphous silicon thin film transistor.

19. The display device according to claim 16, wherein the display device is a liquid crystal display device or an electroluminescence diode.

20. The display device according to claim 16, wherein the pre-charger further includes a transistor connected between an input line of the first driving voltage and the first node to be controlled by the start pulse.

* * * * *